United States Patent
Smith

(10) Patent No.: US 10,288,665 B2
(45) Date of Patent: May 14, 2019

(54) VEHICLE HAVING A DIAGNOSTIC SYSTEM FOR AN ELECTRICAL FUSE

(71) Applicant: LG Chem, Ltd., Seoul (KR)

(72) Inventor: Alexander J. Smith, White Lake, MI (US)

(73) Assignee: LG Chem, Ltd., Seoul (KR)

( * ) Notice: Subject to any disclaimer, the term of this patent is extended or adjusted under 35 U.S.C. 154(b) by 230 days.

(21) Appl. No.: 15/375,463

(22) Filed: Dec. 12, 2016

(65) Prior Publication Data
US 2018/0164364 A1 Jun. 14, 2018

(51) Int. Cl.
G07C 5/08 (2006.01)
G01R 31/00 (2006.01)
G01R 31/07 (2006.01)

(52) U.S. Cl.
CPC ............ *G01R 31/07* (2013.01); *G01R 31/007* (2013.01); *G07C 5/0825* (2013.01)

(58) Field of Classification Search
CPC ..... G01R 31/07; G01R 31/005; G07C 5/0825
See application file for complete search history.

(56) References Cited

U.S. PATENT DOCUMENTS

| | | | |
|---|---|---|---|
| 6,008,627 A | 12/1999 | Narita | |
| 7,636,028 B2* | 12/2009 | Rodseth | H01H 85/30 324/550 |
| 7,792,633 B2* | 9/2010 | Hamama | F02D 41/3005 123/406.13 |
| 2005/0254189 A1 | 11/2005 | Wu et al. | |
| 2016/0341777 A1* | 11/2016 | Liu | G01R 31/007 |
| 2017/0122988 A1* | 5/2017 | Kothekar | H02H 3/046 |
| 2017/0363674 A1* | 12/2017 | Douglass | G01R 31/07 |
| 2017/0365991 A1* | 12/2017 | Kumagai | B60R 16/02 |

FOREIGN PATENT DOCUMENTS

| | | |
|---|---|---|
| DE | 102007054297 A1 | 5/2009 |
| FR | 2730814 A1 | 8/1996 |
| JP | S63131426 A | 6/1988 |
| JP | 2010160026 A | 7/2010 |
| JP | 2016124512 A | 7/2016 |
| KR | 101547597 B1 | 8/2015 |

* cited by examiner

*Primary Examiner* — Thomas Ingram
(74) *Attorney, Agent, or Firm* — Buckert Patent & Trademark Law Firm PC; John F. Buckert

(57) ABSTRACT

A vehicle having a diagnostic system for a fuse is provided. The vehicle has first and second voltage sensors, a current sensor, and a microcontroller. The first and second voltage sensors generate first and second signals, respectively, indicating first and second voltage levels, respectively, at first and second ends, respectively, of the fuse. The current sensor generates a third signal indicating a current level flowing through the fuse. The microcontroller determines first and second voltage values based on the first and second signals, respectively, a current value based on the third signal, and a first resistance value utilizing the first and second voltage values and the current value. The microcontroller generates a diagnostic signal indicating degraded operation of the fuse if the first resistance value is greater than an end-of-life resistance value.

10 Claims, 5 Drawing Sheets

| CURRENT (AMPS) | RESISTANCE (MILLIOHMS) | |
|---|---|---|
| 0 | 0.22 | 102 |
| 50 | 0.22 | 104 |
| 100 | 0.25 | 106 |
| 150 | 0.3 | 108 |
| 200 | 0.35 | 110 |
| 250 | 0.4 | 112 |
| 300 | 0.45 | 114 |

VEHICLE HAVING A DIAGNOSTIC SYSTEM FOR AN ELECTRICAL FUSE

BACKGROUND

The inventor herein has recognized that it would be advantageous to have a vehicle with a diagnostic system for an electrical fuse to determine when the electrical fuse has degraded operation and is close to its operational end-of-life.

SUMMARY

A vehicle having a diagnostic system for an electrical fuse in accordance with an exemplary embodiment is provided. The electrical fuse is electrically coupled between a battery and an electrical load. The vehicle includes a first voltage sensor that generates a first signal indicating a first voltage level at a first end of the electrical fuse. The vehicle further includes a second voltage sensor that generates a second signal indicating a second voltage level at a second end of the electrical fuse. The vehicle further includes a current sensor generating a third signal indicating an amount of electrical current flowing through the electrical fuse. The vehicle further includes a microcontroller operably coupled to the first voltage sensor, the second voltage sensor, and the current sensor. The microcontroller has a memory device that stores a first table therein. The first table has a plurality of resistance values and a plurality of current values associated with the electrical fuse. The microcontroller determines first and second voltage values based on the first and second signals, respectively. The microcontroller determines a current value based on the third signal. The microcontroller determines a first resistance value of the electrical fuse utilizing the first voltage value, the second voltage value, and the current value. The microcontroller retrieves a first stored resistance value from the plurality of resistance values in the first table, utilizing the current value as an index to the first table. The microcontroller multiplies the first stored resistance value by a first value to obtain an end-of-life resistance value. The microcontroller generates a first diagnostic signal indicating degraded operation of the electrical fuse if the first resistance value is greater than or equal to the end-of-life resistance value.

A vehicle having a diagnostic system for an electrical fuse in accordance with another exemplary embodiment is provided. The electrical fuse is electrically coupled between a battery and an electrical load. The vehicle includes a first voltage sensor that generates a first signal indicating a first voltage level at a first end of the electrical fuse. The vehicle further includes a second voltage sensor that generates a second signal indicating a second voltage level at a second end of the electrical fuse. The vehicle further includes a current sensor generating a third signal indicating an amount of electrical current flowing through the electrical fuse. The vehicle further includes a microcontroller operably coupled to the first voltage sensor, the second voltage sensor, and the current sensor. The microcontroller has a memory device that stores a first table therein. The first table has a plurality of resistance values and a plurality of current values associated with the electrical fuse. The microcontroller determines first and second voltage values based on the first and second signals, respectively. The microcontroller determines a current value based on the third signal. The microcontroller determines a first resistance value of the electrical fuse utilizing the first voltage value, the second voltage value, and the current value. The microcontroller retrieves a first stored resistance value from the plurality of resistance values in the first table, utilizing the current value as an index to the first table. The microcontroller generates a first diagnostic signal indicating degraded operation of the electrical fuse if the first resistance value is greater than or equal to the first stored resistance value.

DETAILED DESCRIPTION

Figures 1, 2:
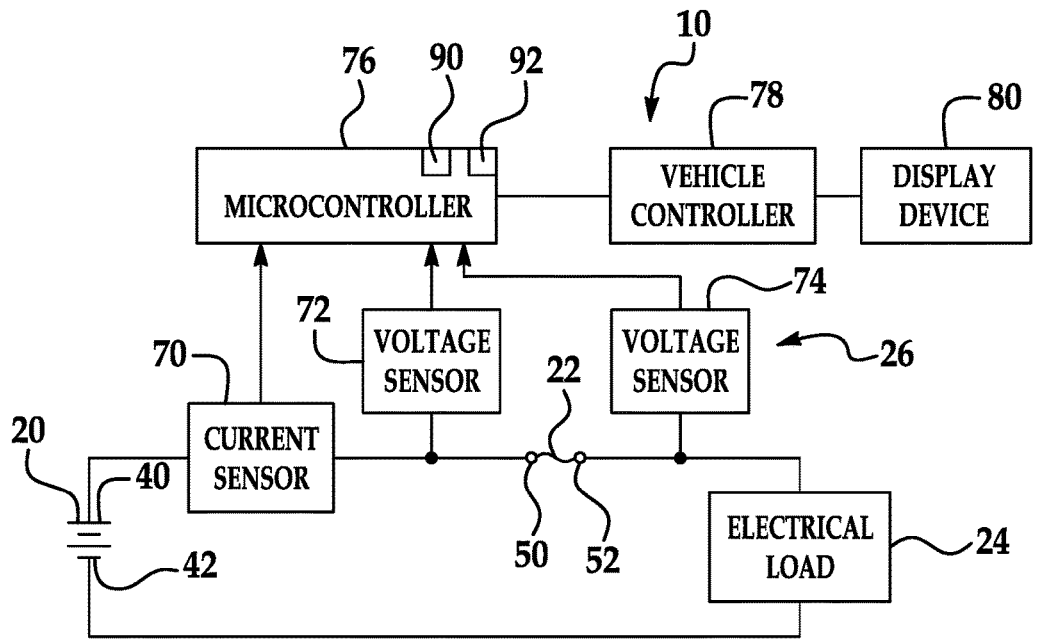
FIG. 1 is a schematic of a vehicle having a diagnostic system for an electrical fuse in accordance with an exemplary embodiment.
FIG. 2 is a schematic of a first table stored in a memory device of a microcontroller utilized in the diagnostic system of FIG. 1.
Figure 3:
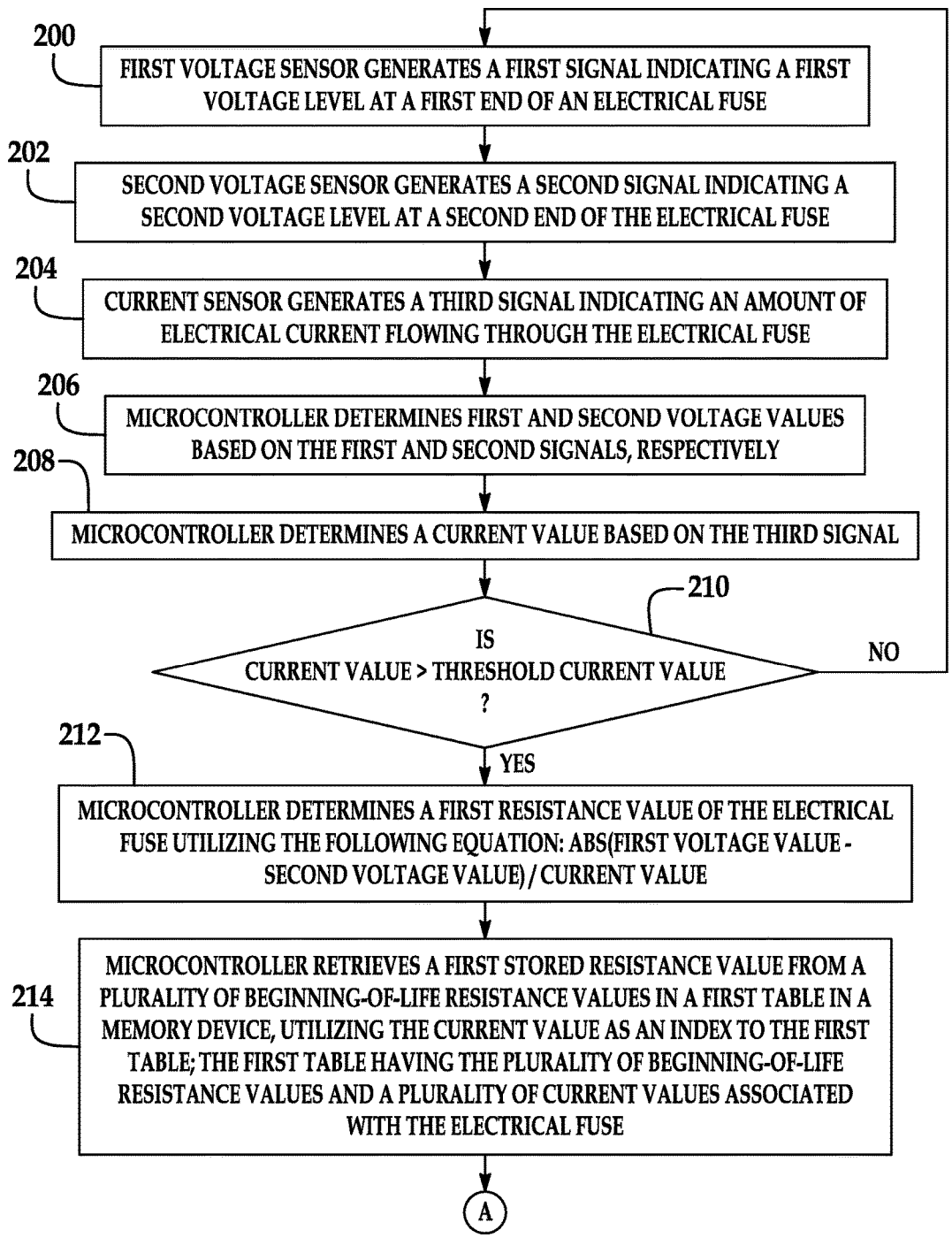
FIGS. 3-4 are flowcharts of a method for determining degraded operation of an electrical fuse in accordance with an exemplary embodiment.

Referring to FIG. 1, a vehicle 10 having a battery 20, an electrical fuse 22, an electrical load 24, and a diagnostic system 26 for the electrical fuse 22 in accordance with an exemplary embodiment is provided. An advantage of the diagnostic system 26 is that the diagnostic system 26 utilizes either stored beginning-of-life resistance values with a multiplier value, or stored end-of-life resistance values of the electrical fuse 22 and a calculated resistance value, to determine whether the electrical fuse has degraded operation.

The battery 20 is provided to supply an operational voltage to the electrical load 24. The battery 20 includes a positive terminal 40 in a negative terminal 42. The positive terminal 40 is electrically coupled to the current sensor 70. The negative terminal 42 is electrically coupled to a second end of the electrical load 24. In an exemplary embodiment, the battery 20 is a lithium-ion pouch battery.

The electrical fuse 22 is electrically coupled in series between the current sensor 70 and a first end of the electrical load 24. The electrical fuse 22 includes a first end 50 and a second end 52. In an exemplary embodiment, the electrical fuse 22 is a high-current slow-blow electrical fuse. Of course, other types of electrical fuses could be utilized.

The electrical load 24 receives an electrical current from the battery 20 via the electrical fuse 22 when the electrical fuse 22 is not blown (e.g., conducts an electrical current therethrough).

Referring to FIG. 1, the diagnostic system 26 is provided to determine when the electrical fuse 22 has degraded operation. The diagnostic system 26 includes a current sensor 70, a voltage sensor 72, a voltage sensor 74, a microcontroller 76, a vehicle controller 78, and a display device 80.

The current sensor 70 is electrically coupled in series with the battery 20 and the electrical fuse 22. In particular, the current sensor 70 is electrically coupled in series between the positive terminal 40 of the battery 20 and the first end 50 of the electrical fuse 22. The current sensor 70 generates a signal indicating an amount of electrical current flowing through the electrical fuse 22, which is received by the microcontroller 76.

The voltage sensor 72 is electrically coupled to the first end 50 of the electrical fuse 22. The voltage sensor 72 generates a signal indicating a first voltage level at the first end 50 of the electrical fuse 22, which is received by the microcontroller 76.

The voltage sensor 74 is electrically coupled to the second end 52 of the electrical fuse 22. The voltage sensor 74 generates a signal indicating a second voltage level at the second end 52 of the electrical fuse 22, which is received by the microcontroller 76.

The microcontroller 76 includes a microprocessor 90 and a memory device 92. The microcontroller 76 is programmed to perform at least a portion of the steps described herein, and executes software instructions stored in the memory device 92 to perform the associated steps. The microcontroller 76 operably communicates with the current sensor 70, the voltage sensor 72, the voltage sensor 74, the memory device 92, and the vehicle controller 78.

Referring to FIGS. 1 and 2, the memory device 92 has an exemplary table 100 stored therein having beginning-of-life resistance values associated with the electrical fuse 22—which is used to determine degradation of the electrical fuse 22. The table 100 includes records 102, 104, 106, 108, 110, 112, 114 therein. Each record has: (i) an electrical current value, and (ii) a beginning-of-life resistance value of the electrical fuse 22 that is associated with the electrical current value. For example, referring to record 104, the record has an electrical current value of 50 amps and a beginning-of-life resistance value of 0.22 milliohms. Thus, during operation, when the electrical fuse 22 has 50 amps of electrical current flowing therethrough, the electrical fuse 22 should have a resistance that is less than a threshold resistance value (e.g., a first value*0.22 milliohms) if the fuse 22 is not degraded. However, when the electrical fuse 22 has 50 amps of electrical current flowing therethrough and the measured resistance of the electrical fuse 22 is greater than or equal to the threshold resistance value (e.g., a first value*0.22 milliohms), the electrical fuse 22 has degraded operation.

Figures 4, 5:
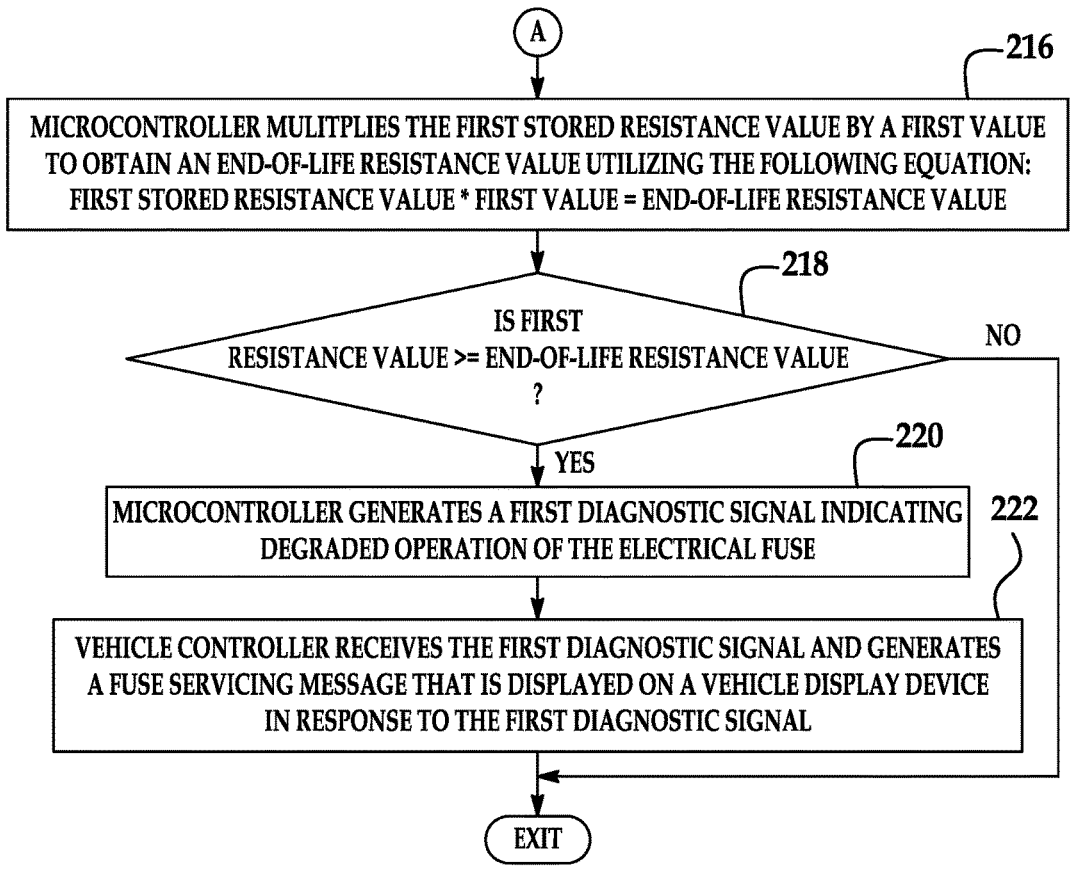
FIG. 5 is a schematic of a second table stored in the memory device of the microcontroller utilized in the diagnostic system of FIG. 1.
Figure 6:
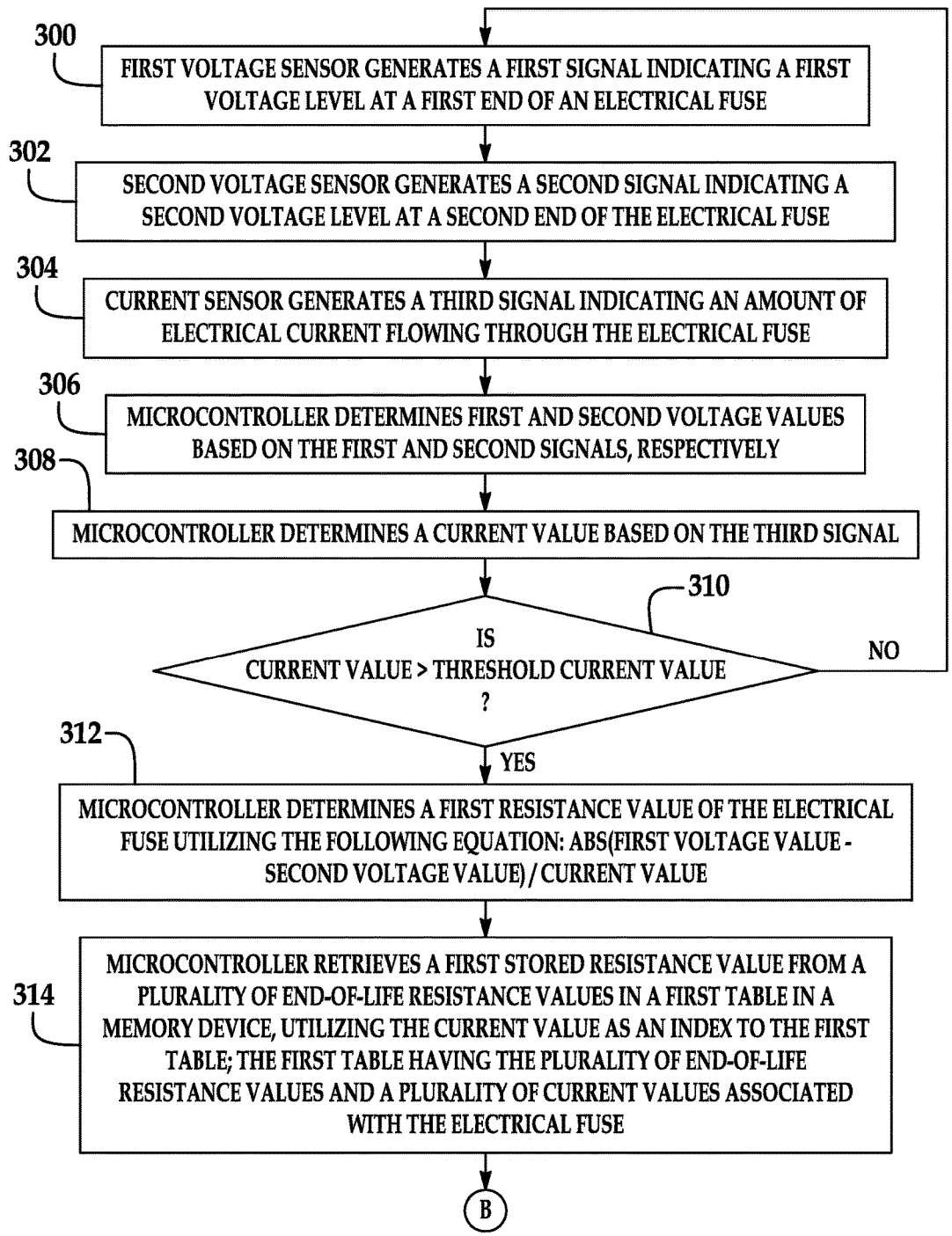
FIGS. 6-7 are flowcharts of a method for determining degraded operation of an electrical fuse in accordance with another exemplary embodiment.
Figure 7:
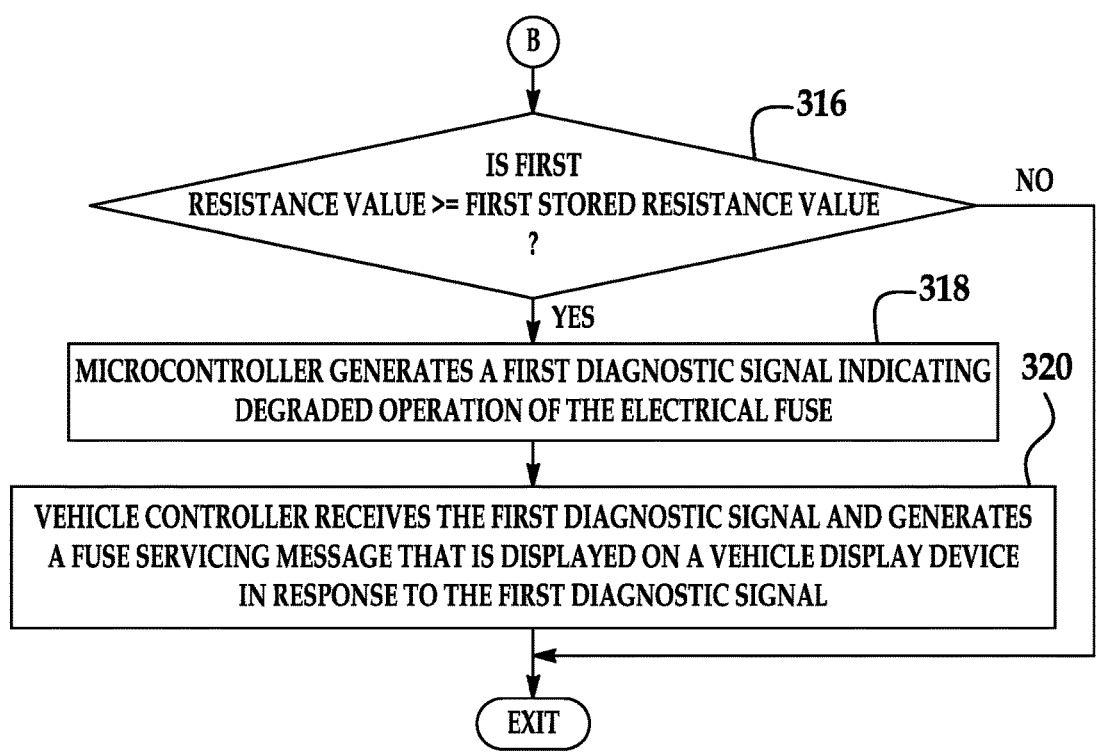

Referring to FIGS. 1 and 5, in an alternative embodiment, the memory device 92 has an exemplary table 140 stored therein having end-of-life resistance values associated with the electrical fuse 22—which can be used to determine degradation of the electrical fuse 22. The table 140 includes records 142, 144, 146, 148, 150, 152, 154 therein. Each record has: (i) an electrical current value, and (ii) an end-of-life resistance value associated with electrical fuse 22. For example, referring to record 144, the record has an electrical current value of 50 amps and an end-of-life resistance value of 0.32 milliohms. Thus, during operation, when the electrical fuse 22 has 50 amps of electrical current flowing therethrough, the electrical fuse 22 should have a resistance that is less than 0.32 milliohms if the fuse 22 is not degraded. However, when the electrical fuse 22 has 50 amps of electrical current flowing therethrough and the measured resistance of the electrical fuse 22 is greater than or equal to 0.32 milliohms, the electrical fuse 22 has degraded operation.

Referring to FIGS. 1-4, a flowchart of a method for determining degradation of an electrical fuse 22 utilizing stored beginning-of-life resistance values, in accordance with an exemplary embodiment is provided.

At step 200, the voltage sensor 72 generates a first signal indicating a first voltage level at the first end 50 of the electrical fuse 22. After step 200, the method advances to step 202.

At step 202, the voltage sensor 74 generates a second signal indicating a second voltage level at the second end 52 of the electrical fuse 22. After step 202, the method advances to step 204.

At step 204, the current sensor 70 generates a third signal indicating an amount of electrical current flowing through the electrical fuse 22. After step 204, the method advances to step 206.

At step 206, the microcontroller 76 determines first and second voltage values based on the first and second signals, respectively. After step 206, the method advances to step 208.

At step 208, the microcontroller 76 determines a current value based on the third signal. After step 208, the method advances to step 210.

At step 210, microcontroller 76 makes a determination as to whether the current value is greater than a threshold current value. If the value of step 210 equals "yes", the method advances to step 212. Otherwise, the method returns to step 200.

At step 212, the microcontroller 76 determines a first resistance value of the electrical fuse 22 utilizing the following equation: Abs(first voltage value−the second voltage value)/current value, wherein Abs corresponds to an absolute value function. After step 212, the method advances step 214.

At step 214, the microcontroller 76 retrieves a first stored resistance value from a plurality of beginning-of-life resistance values in the table 100 in the memory device 92, utilizing the current value as an index to the table 100. The table 100 has the plurality of beginning-of-life resistance values and a plurality of current values associated with the electrical fuse 22. After step 214, the method advances to step 216.

At step 216, the microcontroller 76 multiplies the first stored resistance value by a first value to obtain an end-of-life resistance value utilizing the following equation: first stored resistance value*first value=end-of-life resistance value. After step 216, the method advances to step 218.

At step 218, the microcontroller 76 makes a determination as to whether the first resistance value is greater than or equal to the end-of-life resistance value. If the value of step 218 equals "yes", the method advances to step 220. Otherwise, the method is exited.

At step 220, the microcontroller 76 generates a first diagnostic signal indicating degraded operation of the electrical fuse 22. After step 220, the method advances to step 222.

At step 222, the vehicle controller 78 receives the first diagnostic signal and generates a fuse servicing message that is displayed on the vehicle display device 80 in response to the first diagnostic signal. After step 222, the method is exited.

Referring to FIGS. 1 and 5-7, a flowchart of a method for determining degradation of an electrical fuse 22 utilizing stored end-of-life resistance values, in accordance with another exemplary embodiment is provided.

At step 300, the voltage sensor 72 generates a first signal indicating a first voltage level at the first end 50 of the electrical fuse 22. After step 300, the method advances to step 302.

At step 302, the voltage sensor 74 generates a second signal indicating a second voltage level at the second end 52 of the electrical fuse 22. After step 302, the method advances to step 304.

At step 304, the current sensor 70 generates a third signal indicating an amount of electrical current flowing through the electrical fuse 22. After step 304, the method advances to step 306.

At step 306, the microcontroller 76 determines first and second voltage values based on the first and second signals, respectively. After step 306, the method advances to step 308.

At step 308, the microcontroller 76 determines a current value based on the third signal. After step 308, the method advances to step 310.

At step 310, microcontroller 76 makes a determination as to whether the current value is greater than a threshold current value. If the value of step 310 equals "yes", the method advances step 312. Otherwise, the method returns to step 300.

At step 312, the microcontroller 76 determines a first resistance value of the electrical fuse 22 utilizing the following equation: Abs(first voltage value–the second voltage value)/current value, wherein Abs corresponds to an absolute value function. After step 312, the method advances to step 314.

At step 314, the microcontroller 76 retrieves a first stored resistance value from a plurality of end-of-life resistance values in the table 140 in the memory device 92, utilizing the current value as an index to the table 140. The table 140 has the plurality of end-of-life resistance values and a plurality of current values associated with the electrical fuse 22. After step 314, the method advances to step 316.

At step 316, the microcontroller 76 makes a determination as to whether the first resistance value is greater than or equal to the first stored resistance value. If the value of step 316 equals "yes", the method advances to step 318. Otherwise, the method if exited.

At step 318, the microcontroller 76 generates a first diagnostic signal indicating degraded operation of the electrical fuse 22. After step 318, the method advances to step 320.

At step 320, the vehicle controller 78 receives the first diagnostic signal and generates a fuse servicing message that is displayed on a vehicle display device 80 in response to the first diagnostic signal. After step 320, the method is exited.

The vehicle described herein provides a substantial advantage over other vehicles. In particular, the vehicle utilizes a diagnostic system for determining degraded operation of an electrical fuse. Further, an advantage of the diagnostic system is that the diagnostic system utilizes either stored beginning-of-life resistance values with a multiplier value, or stored end-of-life resistance values of the electrical fuse, and a calculated resistance value to determine whether the electrical fuse has degraded operation.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A vehicle having a diagnostic system for an electrical fuse, comprising:

a first voltage sensor generating a first signal indicating a first voltage level at a first end of the electrical fuse;

a second voltage sensor generating a second signal indicating a second voltage level at a second end of the electrical fuse;

a current sensor generating a third signal indicating an amount of electrical current flowing through the electrical fuse;

a microcontroller determining first and second voltage values based on the first and second signals, respectively, and a current value based on the third signal;

the microcontroller determining a first resistance value of the electrical fuse utilizing the first and second voltage values, and the current value;

the microcontroller retrieving a first stored resistance value associated with the electrical fuse from a plurality of resistance values in a table, utilizing the current value as an index to the table;

the microcontroller multiplying the first stored resistance value by a first value to obtain an end-of-life resistance value;

the microcontroller generating a first diagnostic signal indicating degraded operation of the electrical fuse if the first resistance value is greater than or equal to the end-of-life resistance value; and a vehicle controller operably communicating with the microcontroller, the vehicle controller receiving the first diagnostic signal and generating a fuse servicing message that is displayed on a vehicle display device in response to the first diagnostic signal.

2. The vehicle of claim 1, wherein the plurality of resistance values in the table correspond to beginning-of-life resistance values for the electrical fuse.

3. The vehicle of claim 1, wherein the electrical fuse is a high-current slow-blow electrical fuse.

4. The vehicle of claim 1, wherein the microcontroller determines the first resistance value of the electrical fuse only if the current value is greater than a threshold current value.

5. The vehicle of claim 1, wherein:

the microcontroller being operably coupled to the first voltage sensor, the second voltage sensor, and the current sensor; the microcontroller having a memory device that stores the table therein, the table having the plurality of resistance values and a plurality of current values associated with the electrical fuse.

6. A vehicle having a diagnostic system for an electrical fuse, comprising:

a first voltage sensor generating a first signal indicating a first voltage level at a first end of the electrical fuse;

a second voltage sensor generating a second signal indicating a second voltage level at a second end of the electrical fuse;

a current sensor generating a third signal indicating an amount of electrical current flowing through the electrical fuse;

a microcontroller determining first and second voltage values based on the first and second signals, respectively, and a current value based on the third signal;

the microcontroller determining a first resistance value of the electrical fuse utilizing the first and second voltage values, and the current value;

the microcontroller retrieving a first stored resistance value associated with the electrical fuse from a plurality of resistance values in a table, utilizing the current value as an index to the table;

the microcontroller generating a first diagnostic signal indicating degraded operation of the electrical fuse if the first resistance value is greater than or equal to the first stored resistance value; and a vehicle controller operably communicating with the microcontroller, the vehicle controller receiving the first diagnostic signal and generating a fuse servicing message that is displayed on a vehicle display device in response to the first diagnostic signal.

7. The vehicle of claim 6, wherein the plurality of resistance values in the table correspond to end-of-life resistance values for the electrical fuse.

8. The vehicle of claim 6, wherein the electrical fuse is a high-current slow-blow electrical fuse.

9. The vehicle of claim 6, wherein the microcontroller determines the first resistance value of the electrical fuse only if the current value is greater than a threshold current value.

10. The vehicle of claim 6, wherein:

the microcontroller being operably coupled to the first voltage sensor, the second voltage sensor, and the current sensor; the microcontroller having a memory device that stores the table therein, the table having the plurality of resistance values and a plurality of current values associated with the electrical fuse.

* * * * *